United States Patent
Pereira de Sousa et al.

(10) Patent No.: US 11,552,242 B2
(45) Date of Patent: Jan. 10, 2023

(54) WEYL SEMIMETAL MATERIAL FOR MAGNETIC TUNNEL JUNCTION

(71) Applicant: Regents of the University of Minnesota, Minneapolis, MN (US)

(72) Inventors: Duarte José Pereira de Sousa, Saint Paul, MN (US); Cesar Octavio Ascencio, Falcon Heights, MN (US); Jian-Ping Wang, Shoreview, MN (US); Tony Low, Woodbury, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 1 day.

(21) Appl. No.: 17/225,785

(22) Filed: Apr. 8, 2021

(65) Prior Publication Data

US 2022/0328757 A1    Oct. 13, 2022

(51) Int. Cl.
| | | |
|---|---|---|
| *G11C 11/18* | (2006.01) | |
| *H01L 43/04* | (2006.01) | |
| *H01L 27/22* | (2006.01) | |
| *H01L 43/06* | (2006.01) | |
| *H01L 43/14* | (2006.01) | |
| *G11C 11/16* | (2006.01) | |
| *H01L 43/10* | (2006.01) | |

(52) U.S. Cl.
CPC ............ *H01L 43/04* (2013.01); *G11C 11/161* (2013.01); *G11C 11/1675* (2013.01); *G11C 11/18* (2013.01); *H01L 27/222* (2013.01); *H01L 43/06* (2013.01); *H01L 43/10* (2013.01); *H01L 43/14* (2013.01)

(58) Field of Classification Search
CPC ....... H01L 43/04; H01L 27/222; H01L 43/06; H01L 43/10; H01L 43/14; G11C 11/161; G11C 11/1675; G11C 11/18

USPC ................................................. 365/158, 173
See application file for complete search history.

(56) References Cited

U.S. PATENT DOCUMENTS

| | | | | |
|---|---|---|---|---|
| 7,755,929 | B2 * | 7/2010 | Inomata | H01L 39/228 365/158 |
| 8,228,716 | B2 * | 7/2012 | Nozieres | G11C 11/16 365/158 |
| 10,283,561 | B2 | 5/2019 | Wang et al. | |
| 10,854,257 | B2 | 12/2020 | Wang et al. | |
| 2011/0188157 | A1 * | 8/2011 | Zhao | H01F 10/3272 216/22 |

(Continued)

FOREIGN PATENT DOCUMENTS

| | | | | |
|---|---|---|---|---|
| WO | WO-2015136969 A1 * | 9/2015 | | G01R 33/098 |
| WO | WO-2020231926 A1 * | 11/2020 | | G11C 11/161 |

OTHER PUBLICATIONS

Armitage et al., "Weyl and Dirac Semimetals in Three-Dimensional Solids," Reviews of Modern Physics, accessed from https://arxiv.org/pdf/1705.01111.pdf, Jan. 23, 2018, 63 pp.

(Continued)

*Primary Examiner* — Michael T Tran
(74) *Attorney, Agent, or Firm* — Shumaker & Sieffert, P.A.

(57) ABSTRACT

In some examples, a device includes a magnetic tunnel junction including a first Weyl semimetal layer, a second Weyl semimetal layer, and a dielectric layer positioned between the first and second Weyl semimetal layers. The magnetic tunnel junction may have a large tunnel magnetoresistance ratio, which may be greater than five hundred percent or even greater than one thousand percent.

20 Claims, 11 Drawing Sheets

(56) References Cited

U.S. PATENT DOCUMENTS

| | | | | |
|---|---|---|---|---|
| 2012/0241881 | A1* | 9/2012 | Daibou | H01L 43/08 257/421 |
| 2016/0169986 | A1* | 6/2016 | Li | H01L 43/08 324/228 |
| 2019/0287912 | A1* | 9/2019 | Schmid | H01L 23/5221 |
| 2020/0043978 | A1* | 2/2020 | Zota | H01L 27/22 |
| 2020/0090718 | A1* | 3/2020 | Koui | H01L 27/222 |
| 2020/0225152 | A1* | 7/2020 | Tankhilevich | B82Y 25/00 |
| 2020/0259075 | A1* | 8/2020 | Lee | G11C 11/161 |
| 2021/0012940 | A1* | 1/2021 | Salahuddin | H01L 43/08 |
| 2021/0125651 | A1* | 4/2021 | Wang | G11C 11/5607 |

OTHER PUBLICATIONS

Jia et al., "Weyl Semimetals Fermi Arcs and Chiral Anomalies (A Short Review)," Nature Materials, vol. 14, accessed from https://arxiv.org/abs/1612.00416, Dec. 8, 2016, 15 pp.

LV et al., "Observation of Weyl nodes in TaAs," Nature Physics, vol. 11, DOI: 10.1038/NPHYS3426, Sep. 2015, pp. 724-727.

Wan et al., "Topological semimetal and Fermi-arc surface states in the electronic structure of pyrochlore iridates," American Physical Society, Physical Review B 83, DOI: 10.1103/PhysRevB.83.205101, May 2, 2011, pp. 205101-1-205101-9.

Burkov et al., "Wely Semimetal in a Topological Insulator Multilayer," Physical Review Letters, vol. 107, No. 12, DOI:10.1103/PhysRevLett.107.127205, May 27, 2011, 4 pp.

Ma et al., "Direct optical detection of Weyl fermion chirality in a topological semimetal," Nature Physics, vol. 13, DOI: 10.1038/NPHYS4146, May 29, 2017, pp. 842-847.

Burkov, "Chiral Anomaly and Diffusive Magnetotransport in Weyl Metals," Physical Review Letters, vol. 113, accessed from https://arxiv.org/pdf/1409.0013.pdf, Jul. 19, 2018, 5 pp.

Burkov, "Chiral anomaly and transport in Weyl metals," Journal of Physics: Condensed Matter, vol. 27, accessed from https://arxiv.org/pdf/1502.07609.pdf, Feb. 26, 2015, 35 pp.

Parameswaran et al., "Probing the chiral anomaly with nonlocal transport in three dimensional topological semimetals," Physical Review X, vol. 4, 031035, accessed from https://arxiv.org/pdf/1306.1234.pdf, Jul. 23, 2014, 10 pp.

Yuan et al., "The discovery of dynamic chiral anomaly in a Weyl semimetals NbAs," Nature Communications, vol. 12, Article 1259, https://doi.org/10.1038/s41467-020-14749-4, Mar. 6, 2020, 7 pp.

Chang et al., "Chiral magnetic effect in two-band lattice model of Weyl semimetal," Physical Review B, vol. 91, DOI:10.1103/PhysRevB.91.115203, Mar. 17, 2015, 11 pp.

Dey et al., "Dynamic chiral magnetic effect and anisotropic natural optical activity of tilted Weyl semimetals," Scientific Reports, Nature Research, vol. 10, No. 1, DOI:10.1038/s41598-020-59385-6, Feb. 2020, 11 pp.

Liu et al., "Giant anomalous Hall effect in a ferromagnetic Kagome-lattice semimetal," PMC, Nature Physics, vol. 14, No. 11, doi:10.1038/s41567-018-0234-5, Nov. 2018, pp. 1125-1131.

Liu et al., "Magnetic Weyl Semimetal Phase in a Kagome Crystal," Science 365, DOI:10.1126/science.aav2873, accessed from https://arxiv.org/abs/1909.09580, Sep. 20, 2019, pp. 1282-1285.

Azadani et al., "Ferromagnetic phase of spinal compound MgV2O4 and its spintronics properties," Physical Reviews B, vol. 102, DOI:10.1103/PhysRevB.102.155144, accessed from https://arxiv.org/abs/2009.10323, Sep. 22, 2010, 6 pp.

Jiang et al., "Magnetic Weyl semimetals with diamond structure realized in spinel compounds," Physical Reviews B, vol. 101, DOI:10.1103/PhysRevB.101.121113, accessed from https://arxiv.org/abs/1910.03195, Oct. 8, 2019, 7 pp.

Ghimire et al., "Creating Weyl nodes and controlling their energy by magnetization rotation," American Physical Society, Physical Review Research 1, DOI: 10.1103/PhysRevResearch.1.032044, Dec. 26, 2019, 7 pp.

Istas et al., "Pushing the limit of quantum transport simulations," American Physical Society, Physical Review Research 1, DOI:https://doi.org/10.1103/PhysRevResearch.1.033188, Dec. 19, 2019, pp. 033188-1-033188-18.

Vazifeh et al., "Electromagnetic Response of Weyl Semimetals," Physical Review Letters, vol. 111, DOI:10.1103/PhysRevLett.111.027201, accessed from https://arxiv.org/abs/1303.5784, Jun. 27, 2013, 5 pp.

Butler, "Tunneling magnetoresistance from a symmetry filtering effect," IOP Publishing, Science and Technology of Advanced Materials, vol. 9, doi:10.1088/1468-6996/9/1/014106, Apr. 21, 2008, 17 pp.

Greenaway et al., "Resonant tunneling between the chiral Landau states of twisted graphene lattices," Nature Physics, vol. 11, DOI:10.1038/nphys3507, accessed from https://arxiv.org/abs/1509.06208, Oct. 21, 2015, 13 pp.

Wallbank et al., "Tuning the valley and chiral quantum state of Dirac electrons in van der Waals heterostructures," Science, vol. 353, No. 6299, DOI: 10.1126/science.aaf4621, Aug. 5, 2016, pp. 575-579.

Feenstra et al., "Single-particle tunneling in doped graphene-insulator-graphene junctions," American Institute of Physics, Journal of Applied Physics, vol. 111, doi:10.1063/1.3686639, Feb. 23, 2012, 10 pp.

Britnell et al., "Resonant tunnelling and negative differential conductance in graphene transistors," Macmillan Publishers Ltd., Nature Communications, vol. 4, No. 1794, DOI: 10.1038/ncomms2817, Apr. 30, 2013, 5 pp.

Bowen et al., "Nearly total spin polarization in La2/3Sr1/3MnO3 from tunneling experiments," ResearchGate, Applied Physics Letters, vol. 82, DOI:10.1063/1.1534619, Nov. 2002, 3 pp.

Slonczewski et al., "Conductance and exchange coupling of two ferromagnets separated by a tunneling barrier," American Physical Society, Physical Review B, vol. 39, No. 10, Apr. 1, 1989, pp. 6995-7002.

Wang et al., "A Single Pair of Weyl Fermions in Half-metallic EuCd2As2 Semimetal," American Physical Society, Physical Review B, vol. 99, Issue 24, https://doi.org/10.1103/PhysRevB.99.245147, Jun. 15, 2019, 21 pp.

U.S. Appl. No. 17/249,105, filed Feb. 19, 2019, naming inventors Wang et al.

U.S. Appl. No. 16/861,869, filed Apr. 29, 2020, naming inventors Wang et al.

Bardeen, "Tunneling From a Many-Particle Point of View," Physical Review Letters, vol. 6, No. 2, Jan. 15, 1961, 3 pp.

Soh et al., "Ideal Weyl semimetal induced by magnetic exchange," American Physical Society, Physical Review B, vol. 100, Feb. 28, 2020, pp. 201102-1-201102-6.

Aoki et al., "Spin transfer switching in the nanosecond regime for CoFeB/MgO/CoFeB ferromagnetic tunnel junctions," American Institute of Physics, Journal of Applied Physics, vol. 103, 103911, https://doi.org/10.1063/1.2930873, May 28, 2008, 5 pp.

Sakuraba et al., "Giant tunneling magnetoresistance in Co2MnSi / Al—O / Co2MnSi magnetic tunnel junctions," American Institute of Physics, Applied Physics Letters, vol. 88, 192508, https://doi.org/10.1063/1.2202724, May 10, 2006, 4 pp.

Sun, "Spin angular momentum transfer in current-perpendicular nanomagnetic junctions," IBM Journal of Research and Development, vol. 50, No. 1, Jan. 2006, pp. 81-100.

\* cited by examiner

WEYL SEMIMETAL MATERIAL FOR MAGNETIC TUNNEL JUNCTION

GOVERNMENT INTEREST

This invention was made with government support under Grant No. HR0011-18-3-0004 awarded by the Department of Defense/Defense Advanced Research Projects Agency (DARPA). The government has certain rights in the invention.

This invention was made with government support under FA8650-18-2-7868 awarded by the Air Force Research Lab (DARPA) ERI FRANC program. The government has certain rights in the invention.

This invention was made with government support under 2018-NE-2861-1 awarded by the SRC SMART nCORE program. The government has certain rights in the invention.

This invention was made with government support under 70ANB17H041 awarded by the Dept. of Commerce. The government has certain rights in the invention.

TECHNICAL FIELD

This disclosure relates to magnetic devices including magnetic structures, and more particularly, magnetic tunnel junctions.

BACKGROUND

The scaling of conventional semiconductor devices may be limited by factors including device reliability and increased power consumption. Improvement in the performance of memory and computational devices is continuously pursued. Magnetic tunnel junction structures use relative orientation of two or more magnetic layers to affect resistance of the magnetic tunnel junction structure and may be used in logic and memory devices.

SUMMARY

In general, this disclosure describes various implementations of devices including at least one Weyl semimetal layer. For example, a magnetic tunnel junction device may include two Weyl semimetal layers separated by a dielectric layer. A controller can write a data bit to the magnetic tunnel junction by controlling or setting a magnetization state of one of the Weyl semimetal layers. The controller may be configured to set the magnetization state of a Weyl semimetal layer using spin-orbit torque and/or spin-transfer torque.

A magnetic tunnel junction including a Weyl semimetal layer may have a large tunneling magnetoresistive ratio that makes reading a data bit stored to the Weyl semimetal layer very easy. Thus, the device that includes a spin Hall channel may have a very low energy consumption. A magnetic Weyl semimetal layer tunnel junction may have a large tunneling magnetoresistive ratio because the resistance of the antiparallel state is much larger than the resistance of the parallel state.

In some examples, a device includes a magnetic tunnel junction including a first Weyl semimetal layer, a second Weyl semimetal layer, and a dielectric layer positioned between the first and second Weyl semimetal layers.

In some examples, a device includes a magnetic tunnel junction including a first layer, a second layer comprising a Weyl semimetal material, and a dielectric layer positioned between the first and second layers. The magnetic tunnel junction has a tunnel magnetoresistance ratio greater than one thousand percent.

In some examples, a method includes forming a first Weyl semimetal layer, forming a dielectric layer on the first Weyl semimetal layer, and forming a second Weyl semimetal layer on the dielectric layer.

The details of one or more aspects of the disclosure are set forth in the accompanying drawings and the description below. Other features, objects, and advantages of the techniques described in this disclosure will be apparent from the description, drawings, and claims.

DETAILED DESCRIPTION

Figure 1:
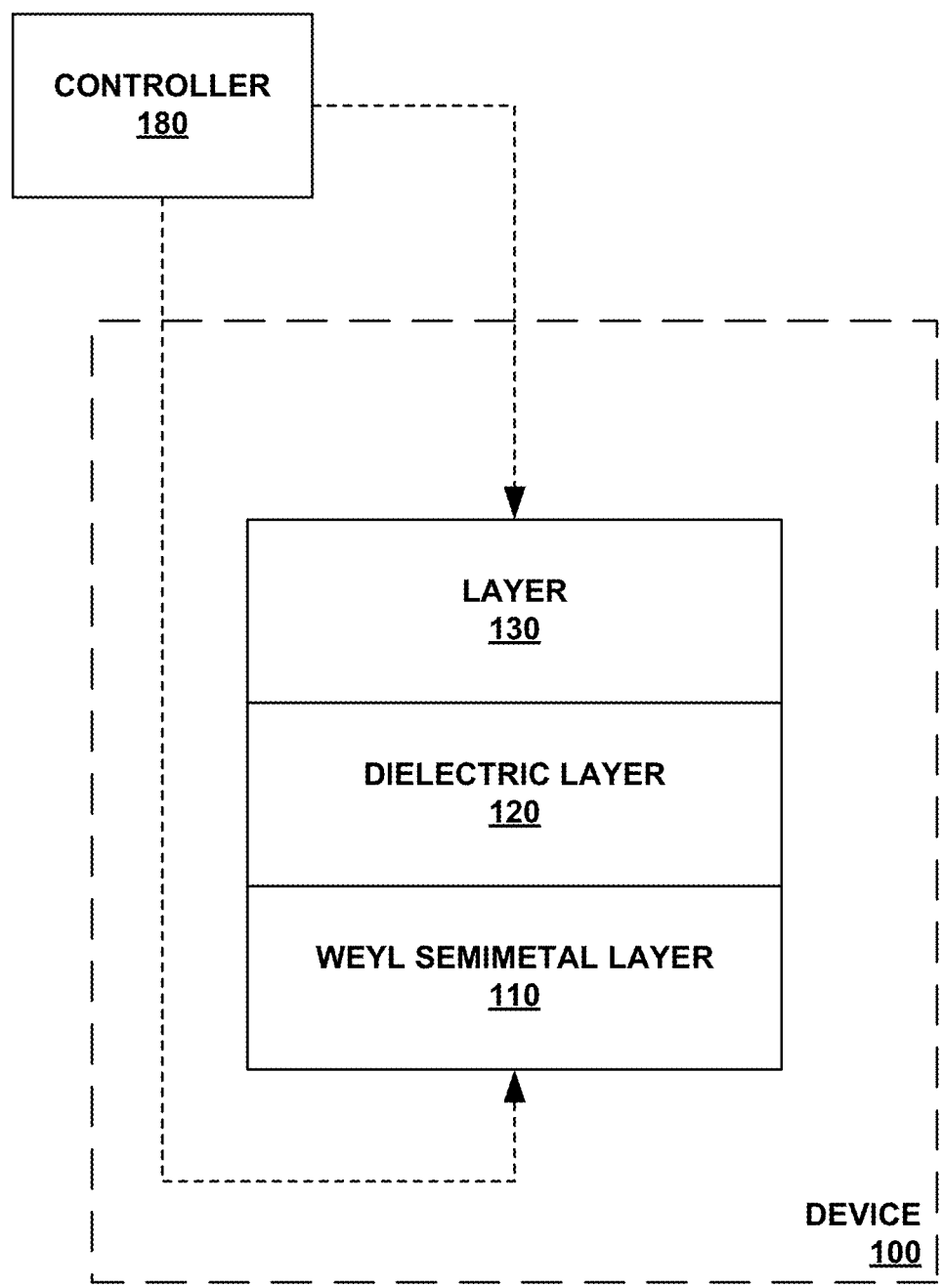
FIG. 1 is a conceptual block diagram of a device including at least one Weyl semimetal layer and a dielectric layer, in accordance with the techniques of this disclosure.

Weyl semimetals are three dimensional materials having topologically protected band crossings in the absence of either time reversal or inversion symmetry. The low-energy quasi-particles around a given band crossing (e.g., a given Weyl node) in Weyl semimetals may behave as chiral massless Weyl fermions with well-defined chirality determined by the topological charge. The topological charge may include the integrated Berry curvature flux over a surface enclosing the Weyl node. This property is responsible for the chiral anomaly and the chiral magnetic effect, which is a transport phenomenon that is unique to Weyl semimetals. In magnetic Weyl semimetals, the strong spin-orbit coupling may cause the magnetization direction to be locked to pairs of topological charge dipoles. Associated with each topological charge dipole are pairs of Weyl sources and sinks with electrons of opposite chirality. Such chirality-magnetization locking may give rise to an interesting interplay between electron spins, chirality, and magnetization, which can allow Weyl semimetals to be used as magnetic compounds in spintronic devices.

Particularly, magnetic tunnel junctions (MTJs) are the building blocks of spintronic devices, such as magnetic random access memory (MRAM). The utility of these devices rely on their ability to exhibit resistances that differ several orders of magnitude for the parallel and antiparallel magnetization configurations. Large tunneling magnetoresistance (TMR) ratios of one thousand percent are theoretically expected in MgO-based epitaxial MTJs. In practice, however, interfacial defects and impurities that originate during the patterning process can suppress this large TMR ratio to lower values. It is highly desirable to obtain larger TMR ratios via mechanisms that are less sensitive to interface defects and more robust against such defects.

Magnetic Weyl semimetal-based MTJ devices may be capable of achieving gigantic TMR ratios with a reduced dependence on the interface quality. Weyl semimetal MTJs are also very robust against other perturbations due to the topological protection of fundamental electronic properties of magnetic Weyl semimetals. The TMR ratios for Weyl semimetal MTJs are ideally infinite at zero temperature, as in half metallic MTJs, and reach values as large as ten thousand percent when considering thermal fluctuations, which is at least one order of magnitude larger than in existing MgO-based MTJs. The properties of Weyl semimetals, rather than the properties of the dielectric layer, are the cause of such high TMR ratios. Thus, the high TMR ratios are, in principle, not sensitive to interfacial defects.

Chirality is a unique, fundamental property of electrons in topological magnetic Weyl semimetals. The chirality, or handedness, of tunneling electrons in magnetic Weyl semimetals is a new degree of freedom that couples to the magnetization of the material. A chirality blocking, where right (left) handed electrons cannot occupy empty left (right) handed states, gives rise to a gigantic resistance when MTJ is in the antiparallel magnetization configuration.

FIG. 1 is a conceptual block diagram of a device 100 including at least one Weyl semimetal layer 110 and a dielectric layer 120, in accordance with the techniques of this disclosure. As shown in FIG. 1, magnetic device 100 also includes layer 130, which may also include a Weyl semimetal material or may include another magnetic material. In some examples, device 100 also includes controller 180 for writing data to and reading data from the magnetic tunnel junction including layers 110, 120, and 130.

Weyl semimetal layer 110 may include a free layer or a fixed layer (e.g., a reference layer). As a free layer, the magnetization state of Weyl semimetal layer 110 may be switchable by spin-orbit torque (SOT) and/or spin-transfer torque (STT) techniques. In examples in which Weyl semimetal layer 110 is a fixed layer, device 100 may be arranged such that layer 130 operates as a free layer with a switchable magnetization state. As a free layer, Weyl semimetal layer 110 may have a thickness that is less than five nanometers, less than three nanometers, or less than two nanometers, such as between five and ten angstroms. As a fixed layer, Weyl semimetal layer 110 may have a thickness that is less than ten nanometers, less than five nanometers, greater than fifteen angstroms, and/or greater than ten angstroms. Topological magnetic Weyl semimetals that display a few Weyl nodes confined into a single momentum space plane can produce a high TMR ratio. Two examples of Weyl semimetals are the ferromagnetic phase EuCdAs compound and CoSnS. Additional examples of Weyl semimetals include $Co_2TiGe$, LaAlGe, PrAlGe, $CoMn_2Ga$, and TaN.

Dielectric layer 120 may be a thin insulating; layer that functions as a tunnel barrier, generally allowing electrons to pass through dielectric layer 120 when layers 110 and 130 are in a parallel configuration and generally blocking electrons when layers 110 and 130 are in a parallel configuration. The chirality-magnetization locking of layers 110 and 130, where each layer includes a Weyl semimetal, may cause a gigantic TMR ratio. The TMR ratio may be defined as the resistance of device 100 in an antiparallel configuration divided by the resistance of device 100 in a parallel configuration. The ratio $(R_P-R_{AP})/R_P \times 100\%$ between the resistance in the parallel magnetization configuration $R_P$ and the resistance in the antiparallel magnetization configuration $R_{AP}$ is a measure of the size of the TMR.

The gigantic TMR can increase with the momentum space separation of the Weyl nodes, and the TMR can approach a value of ten thousand percent, subject to realistic magnetization fluctuations. In some examples, the TMR ratio of the NM including layers 110, 120, and 130 will be greater than five hundred percent, seven hundred percent, greater than one thousand percent, greater than twelve hundred percent, greater than fifteen hundred percent, greater than two thousand percent, greater than twenty-five hundred percent, greater than three thousand percent, greater than four thousand percent, or greater than five thousand percent. In addition, the bulk Weyl and Fermi arc states also produce non-monotonic dependence of the magnetoresistance on the relative angle between the magnetization directions.

Dielectric layer 120 is depicted as directly contacting layers 110 and 130, but alternatively there may be one or more other layers between dielectric layer 120 and layers 110 and/or 130. Although not shown in FIG. 1, device 100 may include an insertion layer between Weyl semimetal layer 110 and dielectric layer 120 and/or an insertion layer between dielectric layer 120 and layer 130. The insertion layer(s) may enhance the effect of the electric field across the layer stack, which includes layers 110, 120, and 130. The insertion layer may include one or more of the following materials: Ir, Rh, Mg, Ta, Mo, any metallic element, or any metallic alloy. Any of the layer stacks shown in FIGS. 1-4 can include an insertion layer adjacent to a dielectric layer.

Dielectric layer 120 may include an insulator, a nitride material, a tunnel barrier material, and/or an oxide material. Suitable oxides include MgO, $Al_xO_y$, $MgAlO_x$, $MgAl_2O_4$, $HfO_x$, $NiO_x$, $CrO_x$, $VO_x$, $SiO_x$, $GdO_x$, $MgZn_2O_4$, $MgNi_2O_4$, ferroelectric materials, two-dimensional materials (e.g., BN) or the like. Other materials that can be used in dielectric layer 120 include $BaTiO_3$ and/or lead magnesium niobate-lead titanate (PMN-PT). Dielectric layer 120 may define any suitable thickness, such as between about 1 nm and about 30 nm, between about 1 nm and about 10 nm, or between 1 nm and 4 nm. Additionally or alternatively, dielectric layer 120 may include two-dimensional materials (e.g. BN). Hexagonal BN can exhibit good tunnel behavior, even when used in a monolayer structure. In some examples, a cobalt iron (CoFe)/BN/cobalt (Co) MTJ can be used with a textured stack to obtain a high magnetoresistance ratio.

Layer 130 may include a magnetic material having a magnetic orientation oriented in plane or out of the plane of layer 130. Additionally, in examples in which the layer stack includes a second ferromagnetic layer (e.g., a fixed layer) on the other side of dielectric layer 120, the magnetic orientation of layer 130 may be either parallel/antiparallel or perpendicular with the magnetic orientation of the second ferromagnetic layer. Layer 130 may include, for example, a CoFeB alloy, such as $Co_{20}Fe_{60}B_2$; a CoFe alloy, CoPd, CoPt, Co, Fe, FePD, FePt, FeIr, $Y_3Fe_5O_{12}$, a Co-based Heusler alloy, a Mn-based alloy (e.g., a Mn-based Heusler alloy), MnN, MnGa, MnGaN, MnGe, MnGeN, MnAl, MnBi, a Fe—Pd alloy, or ferromagnetic insulator (e.g., $Tm_3Fe_5O_{12}$, $Tb_3Fe_5O_{12}$). Example details of ferromagnetic materials are described in commonly assigned U.S. Pat. No. 10,854,257, entitled "Electric Field Switchable Magnetic Devices," issued on Dec. 1, 2020, the entire contents of which are incorporated herein by reference.

Device 100 may also include a substrate such as silicon dioxide that does not conduct electricity. The substrate can provide a foundation or a base for constructing a layer stack on top of the substrate. The substrate can also provide a foundation for the construction of additional devices that are not shown in FIG. 1. There may be one or more other layers between Weyl semimetal layer 110 and the substrate or between layer 130 and the substrate. Additionally or alternatively, device 100 may include an SOT adjacent to layer 110 or 130, as described in further detail below.

Controller 180 configured to write to and read data stored to device 100. Device 100 can further include a thresholding circuit that receives an electrical current that passes through device 100. The thresholding circuit may be configured to determine whether the electrical current is greater than a threshold level in order to determine the bit value stored by layers 110 and/or 130. Additional example details of reading and writing data to magnetic tunnel junctions are described in commonly assigned U.S. patent application Ser. No. 17/078,764, entitled "Topological Material for Trapping Charge and Switching a Ferromagnet," filed on Oct. 23, 2020, and U.S. patent application Ser. No. 17/249,105, entitled "Work Function Structure for Voltage-Controlled Magnetic Anisotropy," filed on Feb. 19, 2021, the entire contents of each of which are incorporated herein by reference.

Controller 180 may be configured to write a bit to device 100 by modulating the voltage across or through an SOT channel or the voltage across the layer stack to switch a magnetization state of layer 110 or 130, e.g., to one of two stable orientations. By modulating the voltage across or through the SOT channel, controller 180 may be able to inject electrical current into the SOT channel, which can generate a spin current inside the SOT channel to switch the magnetization state of layer 110 or 130. Additionally or alternatively, by modulating the voltage across the layer stack, controller 180 may be configured to switch the magnetization state of layer 110 or 130 using STT.

Controller 180 may be configured to read the bit value stored in layers 110 and/or 130 based on an electrical current through the layer stack. For example, controller 180 may be configured to modulate a voltage across the layer stack to a predefined read voltage level. In some examples, controller 180 is configured to connect a drain terminal to a thresholding circuit so that the thresholding circuit can receive the current conducted by the layer stack. The thresholding circuit may be configured to compare the current (or another signal that indicates a magnitude of the current) or a resistance associated with the current to one or more threshold levels to determine values for the bit value. Controller 180 may be configured to then determine the bit value based on an output generated by a thresholding circuit. As compared to existing devices with lower TMR ratios, it may be easier to distinguish between bits stored by device 100 because controller 180 can use a lower read voltage.

A voltage applied to device 100 may produce an electrical current due to electrons tunneling from Weyl semimetal layer 110 to layer 130 through dielectric layer 120. Due to the splitting of electronic states with opposite spins within each of layers 110 and 130, electrons sitting in different spin states will tunnel through dielectric layer 120 with different probabilities. This spin-dependent tunneling may cause a resistance that depends on the relative alignment between the magnetizations of layers 110 and 130, which is called tunneling magnetoresistance.

Although controller 180 is depicted outside of device 100, controller 180 may also be located partially or completely inside or integrated within device 100. The techniques attributed to controller 180 may be implemented, at least in part, in hardware, software, firmware or any combination thereof. For example, various aspects of the techniques may be implemented within one or more processors, including one or more microprocessors, digital signal processors, application-specific integrated circuits, field-programmable gate arrays, memory controllers, or any other equivalent integrated or discrete logic circuitry, as well as any combinations of such components, embodied in programmers, such as physician or patient programmers, stimulators, remote servers, or other devices. The term "processor" or "processing circuitry" may generally refer to any of the foregoing logic circuitry, alone or in combination with other logic circuitry, or any other equivalent circuitry.

Such hardware, software, firmware may be implemented within the same device and/or within separate devices to support the various operations and functions described in this disclosure. For example, any of the techniques or processes described herein may be performed within one device or at least partially distributed amongst two or more devices. In addition, any of the described units, modules or components may be implemented together or separately as discrete but interoperable logic devices.

Controller 180 may be configured to read and write bits to device 100 based on instructions embodied or encoded in an article of manufacture including a non-transitory computer-readable storage medium encoded with instructions. These instructions may be included or encoded in a non-transitory computer-readable storage medium such as RAM, ROM, programmable ROM, erasable programmable ROM, electronically erasable programmable ROM, flash memory, magnetic media, optical media, or any other computer readable storage devices or tangible computer readable media.

In some examples, a computer-readable storage medium comprises non-transitory medium. The term "non-transitory" may indicate that the storage medium is not embodied in a carrier wave or a propagated signal. In certain examples, a non-transitory storage medium may store data that can, over time, change (e.g., in RAM or cache). Elements and functionality of controller 180 may be programmed with various forms of software. The one or more processors may be implemented at least in part as, or include, one or more executable applications, application modules, libraries, classes, methods, objects, routines, subroutines, firmware, and/or embedded code, for example.

Weyl semimetal MTJs can be used in spintronic devices such as in MRAM, in hard disk drive read heads and in MTJ-based spin logic applications. In some examples, device 100 is configured to operate as a random bit generator, for example, for a stochastic computing device or a stochastic spiking neural network. In some examples, by controlling the bias voltage applied to the layer stack, controller 180 may be able to control the thermal stability of layers 110 and/or 130 so that thermal energy at room temperature is sufficient to cause switching between the ferromagnetic coupled and antiferromagnetic coupled states. In such cases, device 100 may be randomly switched between high and low resistance states.

In some examples, the magnetization state of layers 110 and/or 130 can be oscillated so that bias voltage at room temperature is sufficient to cause switching between the ferromagnetic coupled and anti-ferromagnetic coupled states. Similar to above, in such cases, layers 110 and/or 130 may be randomly switched between high and low resistance states in intervals on the order of nanoseconds or several-hundred picoseconds. This may be used to produce random bits, e.g., as part of a random bit stream for a stochastic computing device or a stochastic spiking neural network.

Additionally or alternatively, device 100 can be used for neuromorphic computing applications because the magnetization state of layers 110 and/or 130 can operate similar to a stochastic synapse and/or a neuron. A stochastic synapse is a system where the synaptic weights are given by probability rather than by analog amplitudes. Every synapse has a weight that the synapse multiplies with an input to generate an output. Analog synapse can have any number between zero and one for the synaptic weight. A stochastic synapse generates a zero or one, but the probability of zero or one can be used to assign an analog value. The stochastic synapse gives a weight by probability rather than an amplitude.

Figure 2B:
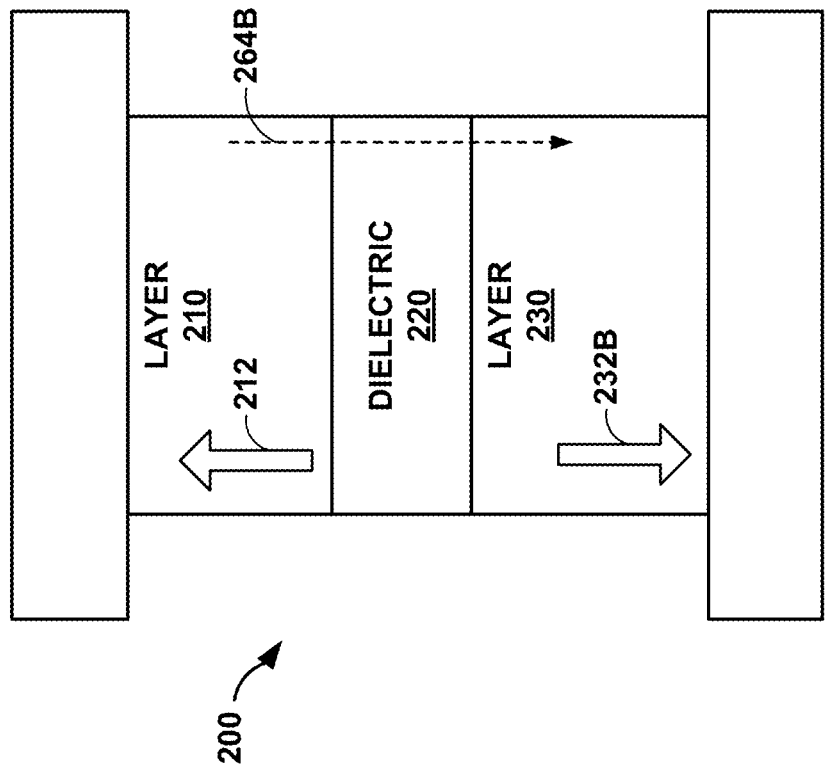
FIGS. 2A and 2B are conceptual diagrams of a magnetic tunnel junction, in accordance with examples of the disclosure.
Figure 2A:
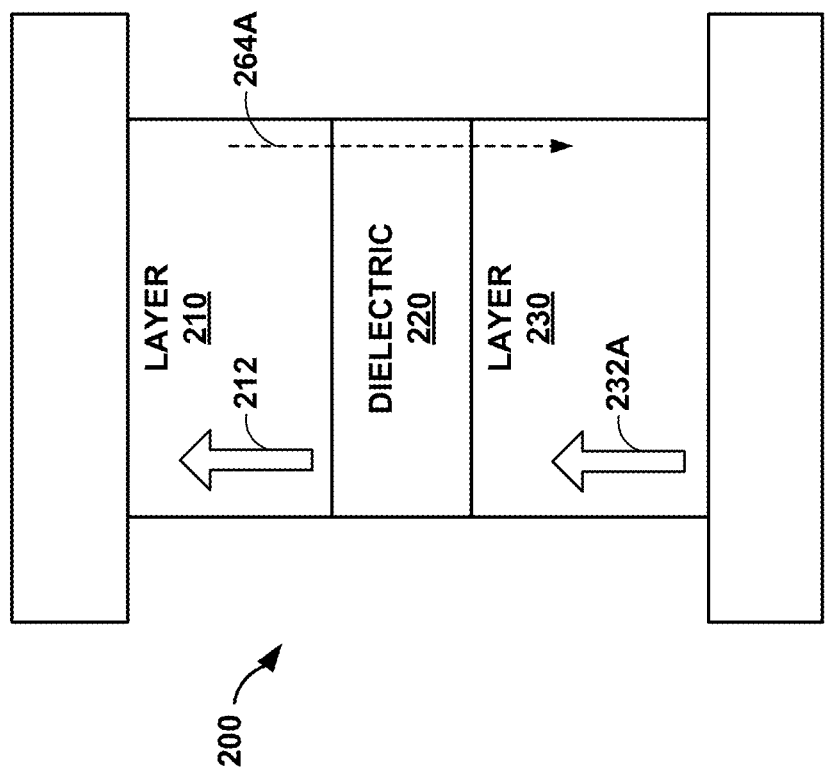

FIGS. 2A and 2B are conceptual diagrams of a magnetic tunnel junction, in accordance with examples of the disclosure. The magnetic tunnel junction shown in FIGS. 2A and 2B include dielectric layer 220 and Weyl semimetal layers 210 and 230. The magnetic tunnel junction can store a data bit in the magnetization state of Weyl semimetal layer 230. The Weyl semimetal layers 210 and 230 could have in-plane magnetic anisotropy or perpendicular magnetic anisotropy.

Weyl semimetal layer 210 may include a first composition that is different from the composition of Weyl semimetal layer 230. For example, Weyl semimetal layer 230 may be part of a multi-layer composite structure. The multi-layer composite structure may include a spacer layer positioned between a Weyl semimetal layer and another magnetic layer. Example details of multi-layer composite structures are described in commonly assigned U.S. patent application Ser. No. 16/861,869, entitled "Electric Field Switchable Magnetic Devices," filed on Apr. 29, 2020, the entire contents of which are incorporated herein by reference.

To read the value of the data bit, a controller may be configured to cause charge current 264A or 264B to pass through layers 210, 220, and 230. When charge current 264A or 264B is passed through the magnetic tunnel junction, the resistance depends on whether the magnetization states 212, 232A, and 232B of Weyl semimetal layers 210 and 230 are parallel or antiparallel. Parallel magnetization states 212 and 232A results in low resistance, and antiparallel magnetization states 212 and 232A results in high resistance. Although shown as left-right orientations, magnetization states 212, 232A, and 232B may instead have up-down orientations. The charge current becomes spin polarized while passing through Weyl semimetal layers 210 and 230. The relative orientation of the spin and magnetization will either produce low or high resistance.

Thus, in examples in which controller causes a particular voltage across layers 210, 220, and 230, the controller can determine the bit value stored in Weyl semimetal layer 230 based on the magnitude of the current conducted through layers 210, 220, and 230. For example, a thresholding circuit may be configured to compare an indication of the current or a resistance value that is associated with the current to a threshold level. The controller may be configured to determine the bit value stored in Weyl semimetal layer 230 based on an output of the thresholding circuit. A large TMR ratio for device 200 can be beneficial because the current 264A will be much larger than current 264B, as compared to an existing device, allowing for a controller to easily distinguish between bit values.

A controller may be configured to write a bit to Weyl semimetal layer 230 by switching the magnetization state 232A or 232B of Weyl semimetal layer 230. The controller may be configured to switch the magnetization state of Weyl semimetal layer 230 using STT and/or SOT. The controller can use STT by modulating the voltage across the magnetic tunnel junction to cause current 264A or 264B to conduct through the magnetic tunnel junction. A large enough current or a large enough electric field can write a data bit by switching the magnetization state 232A or 232B by STT. The magnitude of a read current may be much less than the magnitude of a write current.

Additionally or alternatively, a controller may be configured to switch the magnetization state of Weyl semimetal layer 230 using SOT by modulating the voltage across or through an SOT channel to cause a current to conduct through the SOT channel. The spin polarized electrons will accumulate at the interface of Weyl semimetal layer 230 and the SOT channel. The relative orientations of the spin polarized electrons and magnetization state 232A or 232B results in a resistance change. For example, the spin polarized electrons are parallel with magnetization state 232A, which results in low resistance. The spin polarized electrons are antiparallel with magnetization state 232B, which results in high resistance.

Figure 3:
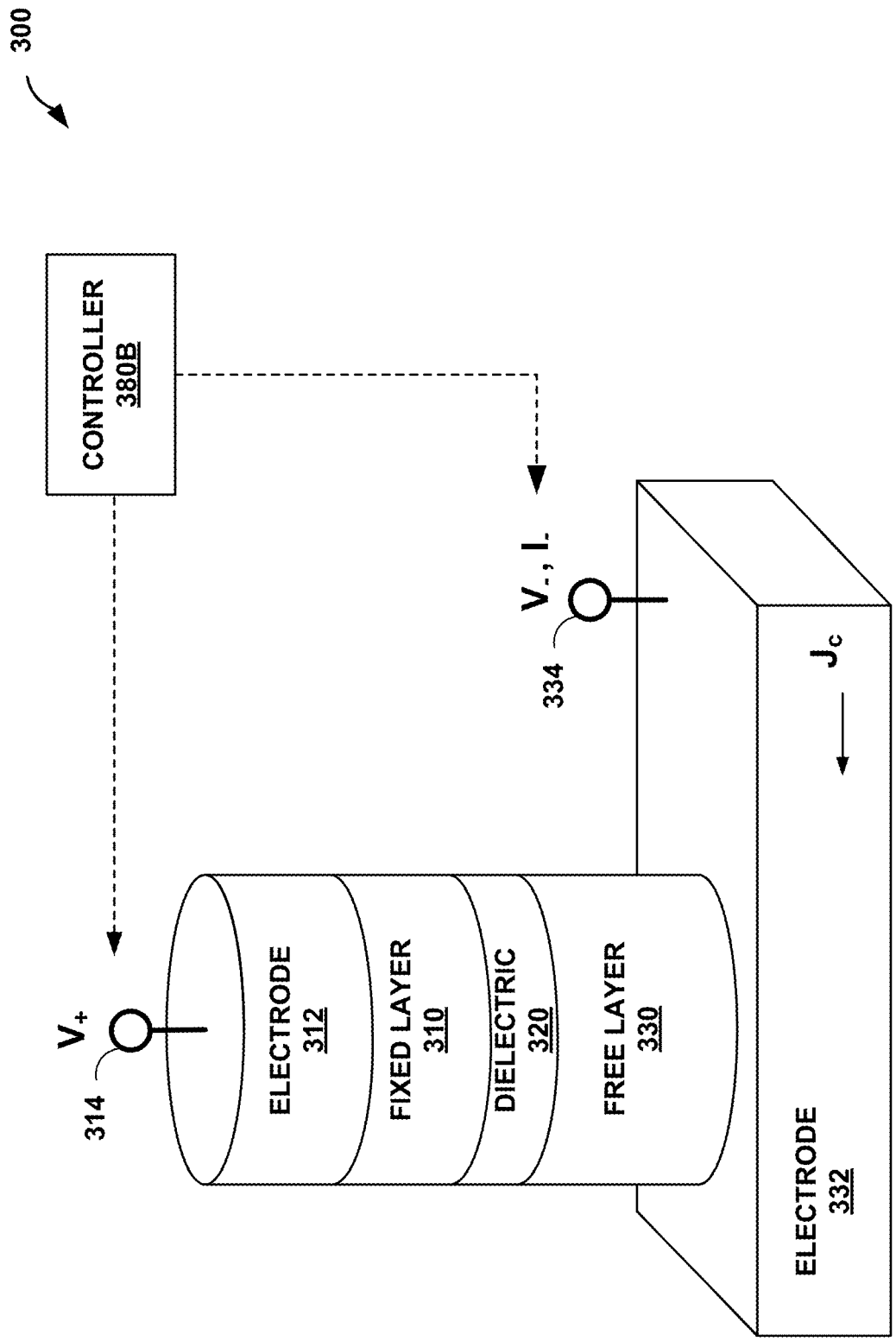
FIG. 3 is a conceptual block diagram of a two-terminal device, in accordance with the techniques of this disclosure.

FIG. 3 is a conceptual block diagram of a two-terminal device 300, in accordance with the techniques of this disclosure. Device 300 only has two terminals (e.g., terminals 314 and 334), whereas device 400 shown in FIG. 4 has three terminals. For a two-terminal device, controller 380 may be configured to write and read bits using different voltages across the layer stack of device 300, where a magnitude of the write voltage may be greater than a magnitude of the read voltage. The voltage across the layer stack may create an electric field through fixed layer 310, dielectric layer 320, and free layer 330 that can switch the magnetization state of free layer 330. Additional example details of two-terminal devices are described in commonly assigned U.S. Pat. No. 10,283,561, entitled "Two-Terminal Spintronic Devices," issued on May 7, 2019, the entire contents of which are incorporated herein by reference.

Figure 4:
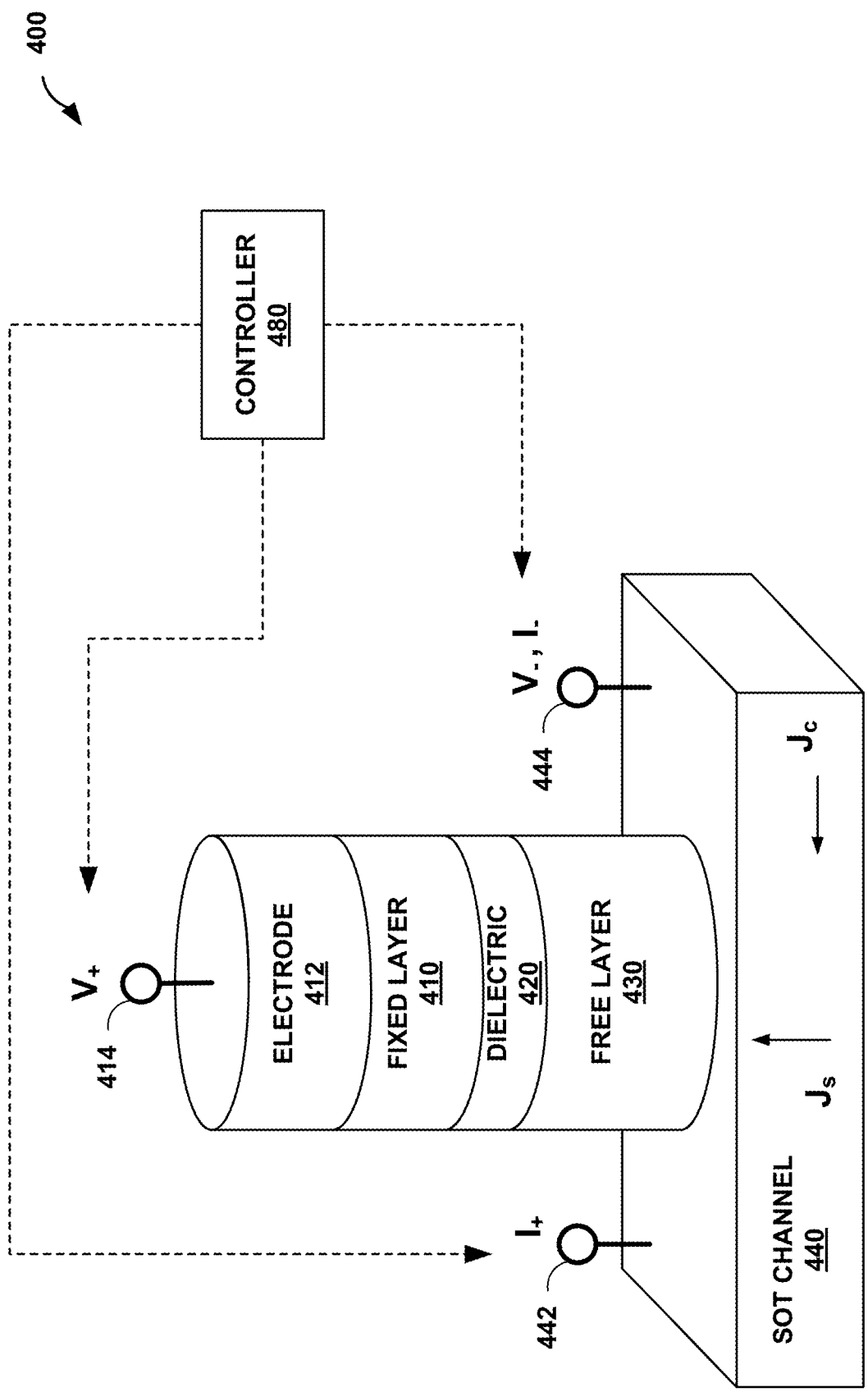
FIG. 4 is a conceptual block diagram of a three-terminal device, in accordance with the techniques of this disclosure.

FIG. 4 is a conceptual block diagram of a three-terminal device 400, in accordance with the techniques of this disclosure. Similar to controller 380 shown in FIG. 3, controller 480 may be configured to write and read bits by applying voltages across terminals 414 and 444. In addition, controller 480 may be configured to generate a charge current Jc through SOT channel 440 (e.g., a spin Hall channel) by applying a voltage across terminals 442 and 444.

The charge current Jc flowing through SOT channel 440 may not flow into free layer 430 but may instead generate a spin current Js through spin-orbit interactions in SOT channel 440. The spin current Js may push the positive-oriented electrons to the top of SOT channel 440 and push the negative-oriented electrons to the top of SOT channel 440. The net change in the spin polarization is effectively a current of spins of the electrons. Spin current Js may interact with free layer 430 to switch the magnetization state (e.g., magnetization orientation) of free layer 430.

The presence of a spin Hall channel such as SOT channel 440 can lead to efficient switching of Weyl semimetal free layer 430. SOT channel 440 can include heavy metals with a large spin Hall angle. Possible materials for SOT channel 440 include W, Ta, and Pt.

Figure 5A:
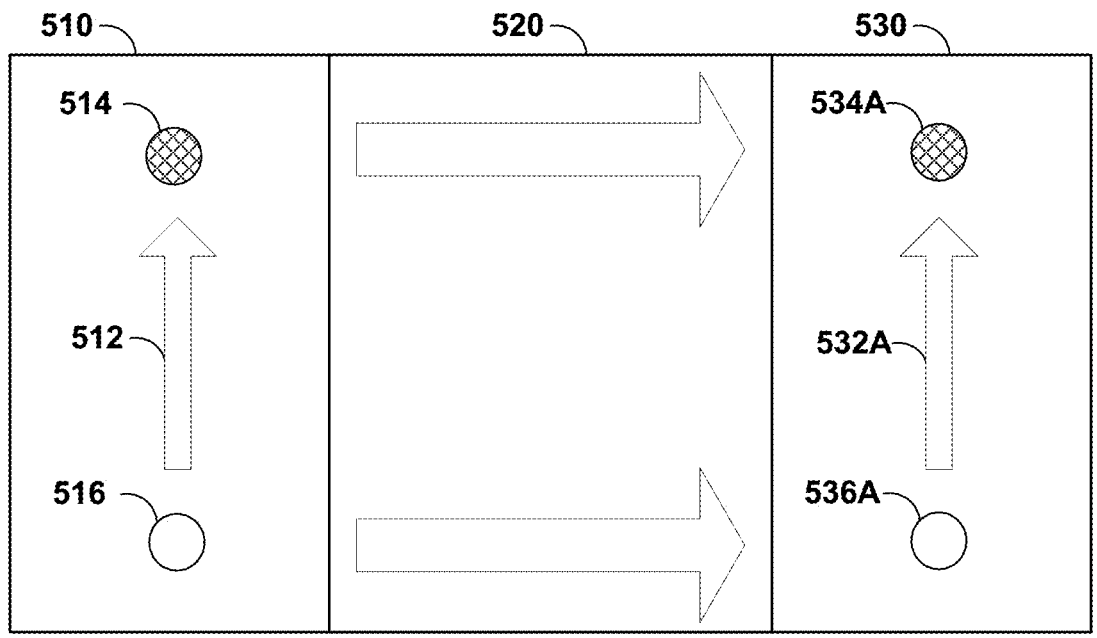
FIGS. 5A and 5B are diagrams showing chiral tunneling magnetoresistance, in accordance with the techniques of this disclosure.
Figure 5B:
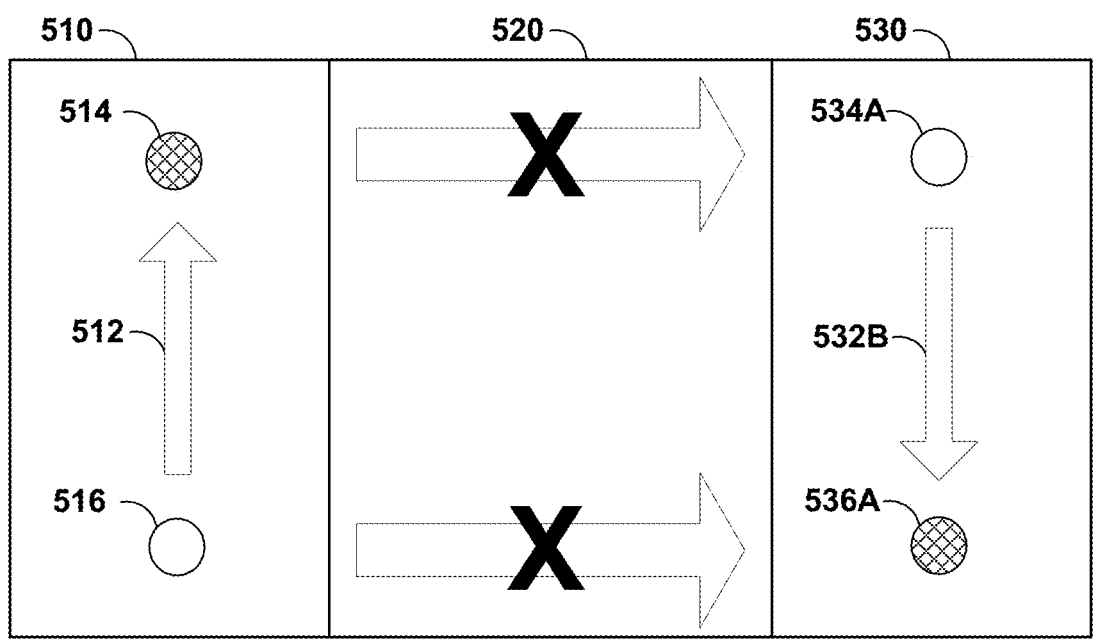

FIGS. 5A and 5B are diagrams showing chiral TMR, in accordance with the techniques of this disclosure. In the parallel magnetization configuration shown in FIG. 5A, the magnetization states with the same chirality are momentum-aligned in opposite sides of the dielectric layer. For example, the orientation of the magnetization state of Weyl semimetal layer 510 is identical to the magnetization state of Weyl semimetal layer 530. The identical magnetization states are symbolized by arrows 512 and 532A pointing in the same direction. Electron 514 may experience relatively low resistance as electron 514 attempts to tunnel through dielectric layer 520 to Weyl semimetal layer 530 because electron 534A has similar chirality as electron 514. Similarly, electron 516 may experience relatively low resistance as electron 516 tunnels through dielectric layer 520 to electron 536A. Electrons may be able to tunnel through the dielectric layer if chirality and momentum can be conserved simultaneously.

In the antiparallel magnetization configuration shown in FIG. 5B, the magnetization states with opposite chirality are momentum-aligned in opposite sides of the dielectric layer. Electron 514 may experience relatively high resistance as electron 514 attempts to tunnel through dielectric layer 520 to Weyl semimetal layer 530 because electron 534B has opposite chirality as electron 514. Similarly, electron 516 may experience relatively high resistance as electron 516 tunnels through dielectric layer 520 to electron 536B. The theoretical impossibility of an electron conserving chirality and momentum in the antiparallel configuration shown in FIG. 5B gives rise to gigantic resistance.

The difference in resistance between the parallel and antiparallel states can result in lower energy consumption during the operation of the device. For example, a large change in resistance between parallel and antiparallel states may allow for easier distinguishing between the parallel and antiparallel states during read operations. Thus, a controller can use a lower read voltage to determine the bit value stored by layers 510 and 530.

A magnetic Weyl semimetal material may have robust electronic properties that are protected by electronic structure topology. In addition to spin, electrons in magnetic Weyl semimetals have an additional degree of freedom: chirality. The full electronic structure of Weyl semimetal materials is highly coupled to the magnetization direction because of the strong spin orbit coupling. Hence, the momentum of right- and left-handed chiral electrons can be manipulated via magnetization.

Figures 6A, 6B:
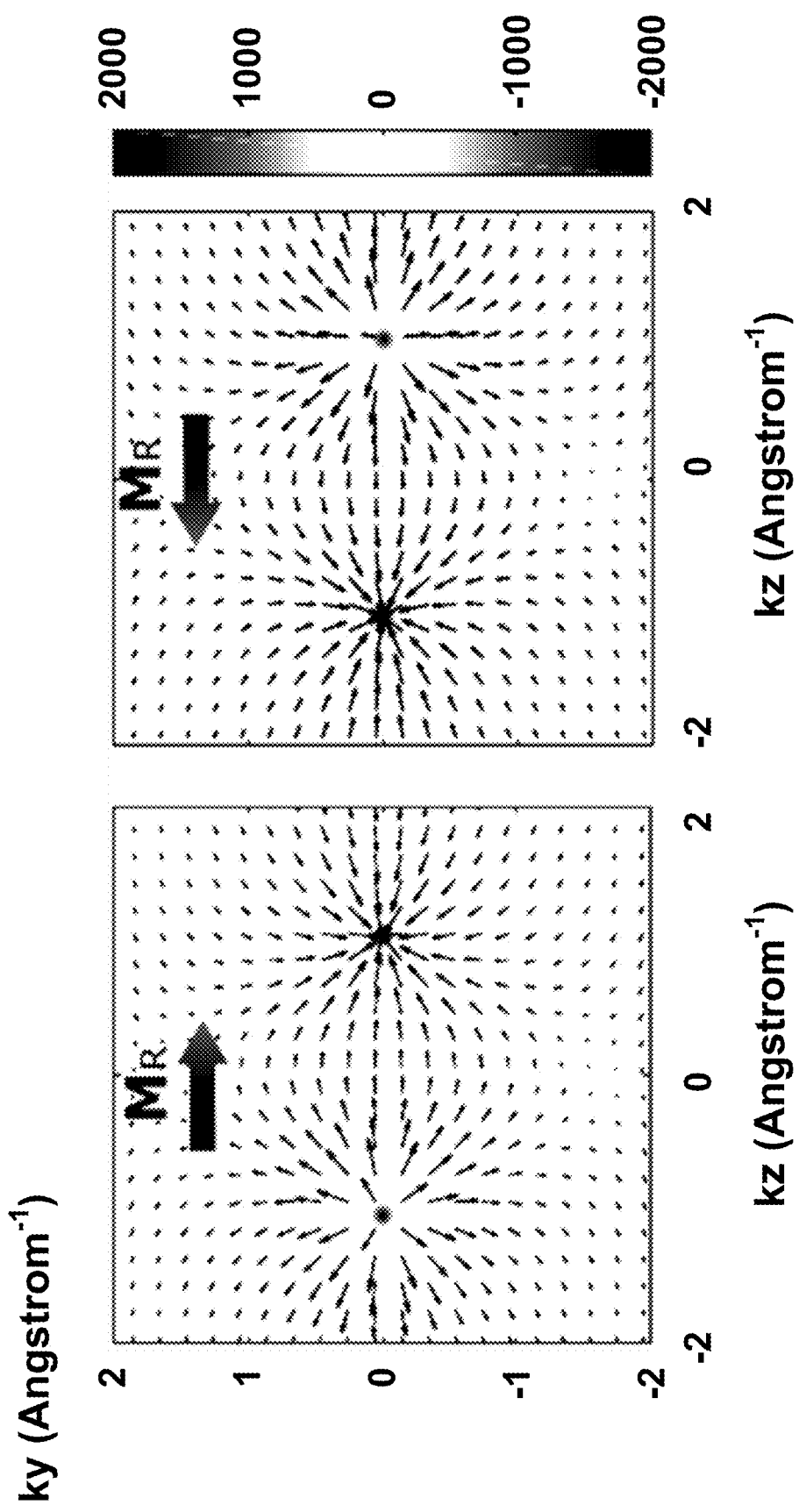
FIGS. 6A and 6B are intensity maps showing the momentum space location of states, in accordance with the techniques of this disclosure.

FIGS. 6A and 6B are intensity maps showing the momentum space location of states, in accordance with the techniques of this disclosure. FIGS. 6A and 6B show the coupling between chirality and magnetization. The intensity map shows the momentum space location of right- and left-handed states via the two hotspots in each graph. The arrows marked "$M_R$" illustrate the magnetization directions for two different situations and the vector fields show the spin texture of magnetic Weyl semimetals. When the magnetization of a Weyl semimetal layer is switched from one graph to the other graph, the momentum space position of right- and left-handed electrons also changes, along with the full spin texture.

The chiral TMR, where the chirality of electrons in the contact play an important role, is a means for achieving gigantic TMR ratios in MTJ devices. This TMR effect relies on the chirality of bulk electronic states of Weyl semimetals and the locking of momentum space position of right- and left-handed electrons with magnetization. Therefore, the TMR effect is not dependent on the interface quality. Moreover, gigantic TMR ratios as high as ten thousand percent are possible, which is at least one order of magnitude higher than TMR ratios for existing spin filtering based MTJs.

For a standard four-bands lattice model describing a three-dimensional magnetic Weyl semimetal constructed on a cubic lattice, the effective Hamiltonian is shown in Equation (1). The period of the cubic lattice is represented by the variable $\alpha$, f(k) and g(k) are structure factors, $\sigma$ represents a vector of Pauli matrices, and the nearest neighbor hopping parameter is represented by t equals one electron-volt. The unit vector pointing along the magnetization direction $\beta$ being associated with the exchange field strength is represented by $\hat{m}$.

$$\text{Hamiltonian} = \tau_z \otimes [f(k) \times \sigma] + \tau_x \otimes [g(k) \times \sigma_0] + \tau_0 \otimes \left(\frac{\beta}{2} \hat{m} \times \sigma\right) \quad (1)$$

$$f(k) = \hat{x} t \sin(k_x a) + \hat{y} t \sin(k_y a) + \hat{z} t \sin(k_z a) \quad (2)$$

$$g(k) = t(1 - \cos(k_x a)) + t(1 - \cos(k_y a)) + t(1 - \cos(k_z a)) \quad (3)$$

$$\sigma = \hat{x}\sigma_x + \hat{y}\sigma_y + \hat{z}\sigma_z \quad (4)$$

In some examples, a single pair of Weyl nodes are located at $k_0^{\pm}=(0,0,\pm k_0)$ with $k_0=(1/a)\times\arccos(1-\beta^2/(8t^2))$. Electrons can tunnel through the barrier with conserved in-plane momentum $k_\parallel=(k_y, k_z)$ due to the translational invariance in the yz-plane and do so with a transmission probability that depends on the angle between $M_L$ and $M_R$. There are three experimentally relevant situations for Weyl-based MTJs: (i) an in-plane MTJ (iMTJ) with an in-plane magnetization rotation ($\theta_L=\phi_L=0$, $\phi_R=90$ degrees), (ii) an iMTJ with an out-of-plane magnetization rotation ($\theta_L=\phi_L=$zero, $\phi_R=$zero), and (iii) a perpendicular MTJ (pMTJ) with an out-of-plane magnetization rotation ($\theta_L=90$ degrees, $\phi_L=\theta_R=$zero).

In magnetic Weyl semimetals, the orientation of the topological charge dipole is locked to the direction of the magnetization, giving rise to chirality-magnetization locking. This is due to the strong spin-orbit coupling in these systems and is exemplified in FIGS. 7A and 7B, where the spin texture field is superposed to the topological charges located at the two Weyl nodes. Although the Weyl nodes remain at $k_0^{\pm}$ in both cases, the topological charges can be swapped, accompanied by the spin texture. Hence, the chirality of electrons with momenta at the vicinity of $k_0^{\pm}$ reverses sign as $M_R$ is reversed from z to −z. Unlike in the parallel magnetization configuration ($\theta_R=$zero), where the electrons for each $k_\parallel$ tunnel into states with the same chirality, electrons are unable to conserve $k_\parallel$ while simultaneously maintaining chirality when the iMTJ is in an antiparallel configuration ($\theta_R=180$ degrees).

This chirality-magnetization locking may lead to a new chiral TMR with a giant TMR. In contrast, an existing MgO-based MTJ without any Weyl materials may rely on the ability of MgO to filter Bloch states by symmetry. The existing MTJ may also rely on the half-metallic nature of $\Delta_1$ orbital states in magnetic transition metal-based alloys.

Chiral massless Weyl fermions can tunnel through a dielectric layer within the context of a transfer Hamiltonian approach. For example, an iMTJ with identical Weyl electrodes of Hamiltonians can be obtained by expanding Equation (1) to linear order in small wave vector, $q=(q_x, q_y, q_z)$, around each Weyl node, as shown in Equation (5). The transport direction is represented by x, the chirality index is $\chi=1$, and v is the Fermi velocity defined as $v=at/\hbar$.

$$\text{Hamiltonian}_e = \hbar v(-i\sigma_x \delta_x + q_y \sigma_y + \chi\cos(k_0 a/2)q_z\sigma_z) \quad (5)$$

Opposite electrodes may be approximately orthogonal everywhere with an exponential tail within the barrier region characterized by an energy independent decay constant. The shape of the barrier potential may slowly vary, as compared to the carrier wavelength. The shape of the barrier potential leads to solutions that are well-localized in the regions of the electrodes. The in-plane translational symmetry can allow for expansion of the solutions in a basis of Bloch states. The states within the barrier region corresponding to the left (L) and right (R) electrodes as shown in Equation (6). The normalization constant related to the interface area A and to the normalization D of the wave functions along the transport direction is represented by $C=(2AD)^{-0.5}$. The exponential tail within a barrier of thickness d is represented by $h^L(x)=\exp(-\kappa x)$ and $h^R(x)=\exp(\kappa(x-d))$ for the left and right electrodes, respectively. For Equation (7), the chirality and band indices are $\chi_{L(R)}=\pm 1$ and $\lambda_{L(R)}=\pm 1$, respectively, where $\pm 1$ is associated with at least one conduction band and $-1$ is associated with a valence band. The wave vector is represented by $q_{L(R)}$, and the periodic part of the in-plane Bloch states $u_{q_{L(R)}}^{\pm}(r_\parallel)$ depends only on the in-plane components of r (e.g., $r_\parallel=(y,z)$).

$$\Psi_{q_{L(R)}}^{\xi_{L(R)}} = C \begin{pmatrix} f_{L(R)}^+ u_{q_{L(R)}}^+(r_\parallel) \\ i\xi_{L(R)} f_{L(R)}^- u_{q_{L(R)}}^-(r_\parallel) \end{pmatrix} \quad (6)$$

$$f_{L(R)}^{\pm} = \sqrt{1 \pm \chi_{L(R)}\lambda_{L(R)}\cos\phi_{L(R)}} \quad (7)$$

$$\cos\phi_{L(R)} = \frac{q_z^{L(R)}}{q_y^{L(R)}}\cos(k_0 a/2) \quad (8)$$

$$q_{L(R)} = \hat{z}q_z^{L(R)}\cos(k_0 a/2) + \hat{y}q_y^{L(R)} \quad (9)$$

$$\xi_{L(R)} = \lambda_{L(R)}\chi_{L(R)}\text{sqn}(q_y^{L(R)}) \quad (10)$$

The matrix element for the tunneling rates is shown in Equation (11), where $\alpha_1$ is a positive constant related to the overlap between the periodic parts of the in-plane Bloch states from opposite sides of the dielectric layer over a unit cell. In addition, dSc is the surface area of an in-plane unit cell, and the Dirac delta function is used for in-plane momentum conservation.

$$M_{LR} = \frac{\hbar}{2\,m}\frac{\alpha_1}{DdS_C}\kappa e^{-\kappa d} \times (f_R^- f_L^- + \chi_L \chi_R \lambda_L \lambda_R f_R^+ f_L^+)\delta(q_L - q_R) \quad (11)$$

$$M_{LR}^P \sim \frac{\hbar}{m}\frac{\alpha_1}{DdS_C}\kappa e^{-\kappa d} \times \delta(q_L - q_R) \quad (12)$$

The tunneling rates for iMTJs in the parallel $\theta_R$=zero and antiparallel configuration $\theta_R$=180 degrees. Both Weyl semimetal contacts can be assumed to have the same Fermi level, i.e., $\lambda_L=\lambda_R$. For the case when the magnetizations are aligned, Weyl nodes with the same chirality on opposite sides of the barrier are momentum-aligned. The corresponding matrix element is represented by Equation (12). In the antiparallel configuration, Weyl nodes of opposite chirality may be momentum-aligned on opposite sides of the barrier. The matrix element for this case with $\chi_L=\chi_R$ is represented by $M_{LR}^{AP}$=zero for all in-plane momenta. Thus, the chirality in the TMR is very important in Weyl semimetal-based MTJs.

This analysis suggests an infinite TMR in iMTJs based on magnetic Weyl semimetals. However, the TMR has a strong dependence on the relative magnetization angle in the antiparallel configuration compared to existing MTJs that lack Weyl materials. Hence, the realistic TMR can be limited by angular fluctuation in magnetization, such as thermal effects.

The conductance of an MTJ can be computed by means of the non-equilibrium Green's function technique. The Hamiltonian is discretized along the x-direction by rewriting Equation (1) as shown in Equation (13) such that the magnetic Weyl semimetal is described as a series of principal layers (PLs) with translational invariance in the yz-plane, as described by $H_W^0$, and connected to the nearest-neighbors PLs via interlayer hopping matrices $\hat{W}$. An expression for the Hamiltonian describing the insulating (I) spacer is shown in Equation (14). The block on-site and hopping matrices are shown in Equations (15)-(17), respectively. The quantum conductance can then be computed using non-equilibrium green function formalism.

$$\text{Hamiltonian}=H_W^0+\hat{W}e^{ik_x x}+\hat{W}^\dagger e^{ik_x x} \quad (13)$$

$$\text{Hamiltonian}_I=H_I^0+\hat{V}e^{ik_x x}+\hat{V}^\dagger e^{ik_x x} \quad (14)$$

$$H_I^0=g_I(k_\parallel)\tau_0 \otimes \sigma_0 \quad (15)$$

$$g_I(k_\parallel)=\epsilon_I+t_x+t_y(1-\cos(k_y a))+t_z(1-\cos(k_z a)) \quad (16)$$

$$\hat{V}=-(t_x/2)\tau_0 \otimes \sigma_0 \quad (17)$$

Figure 7A:
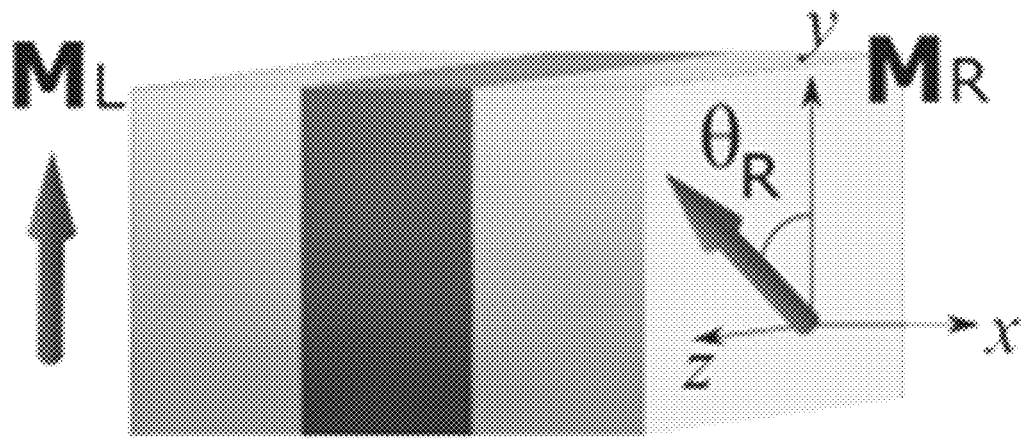
FIGS. 7A and 7B are diagrams showing in-plane and perpendicular magnetic tunnel junctions, in accordance with the techniques of this disclosure.
Figure 7B:
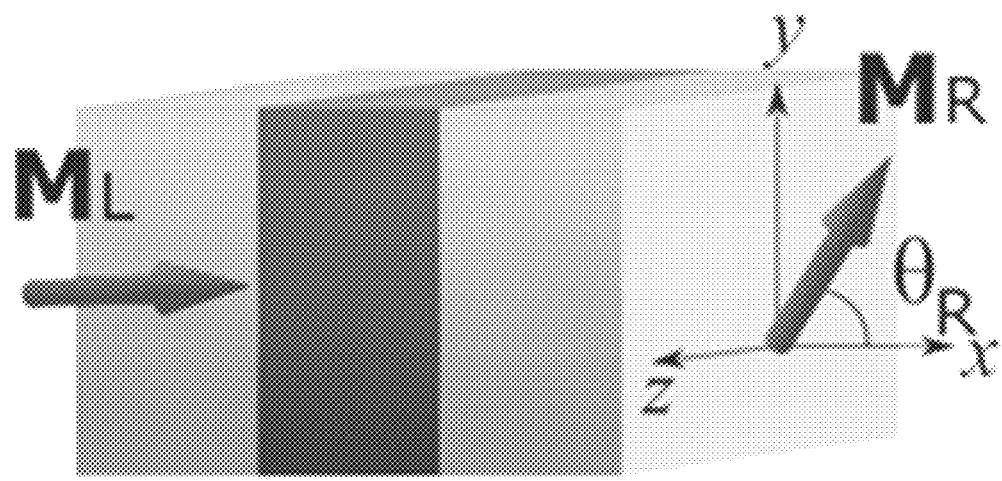
Figure 8:
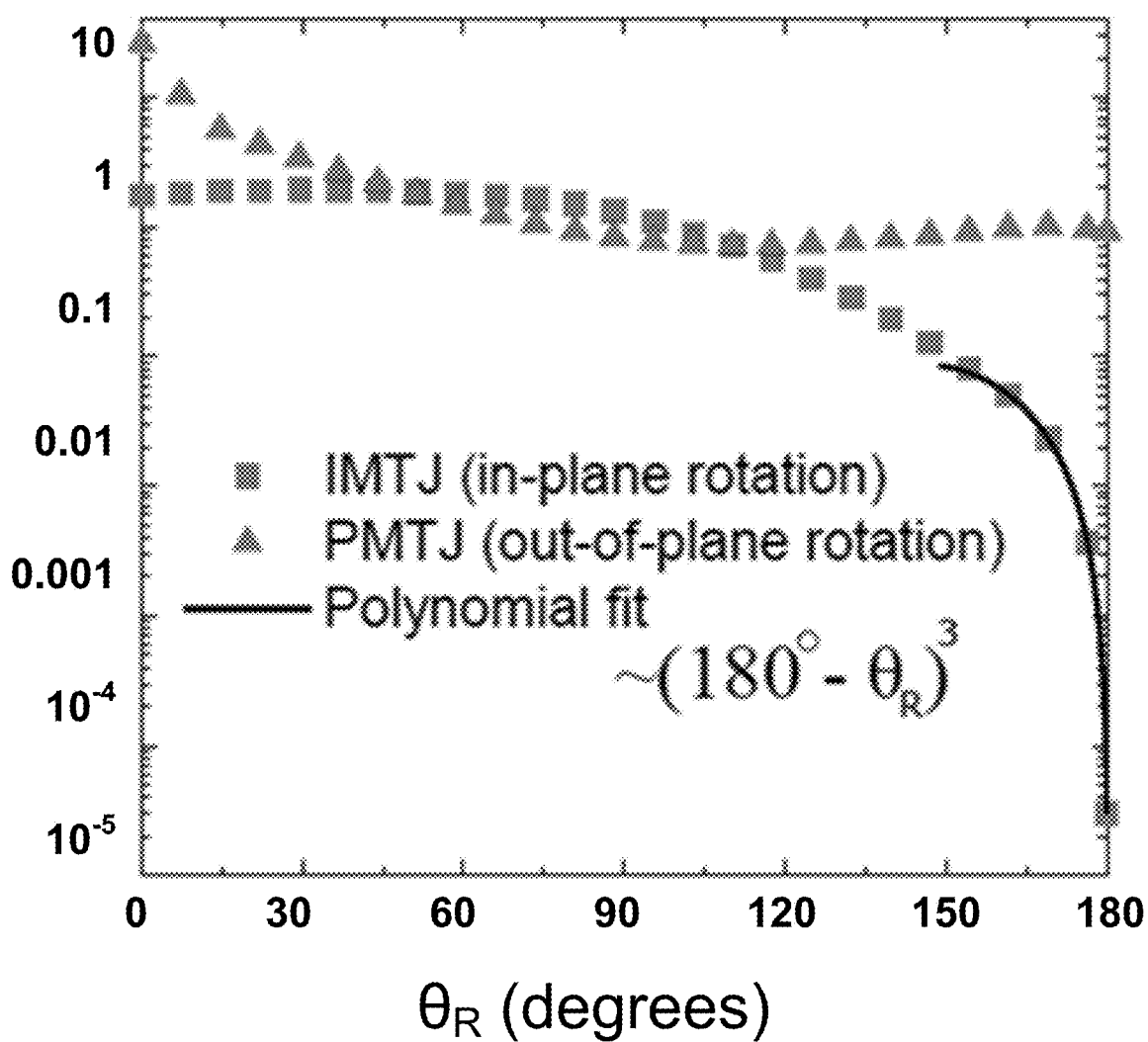
FIG. 8 is a graph illustrating the dependence of conductance on the relative angle between the magnetizations of left and right Weyl contacts, in accordance with the techniques of this disclosure.

FIGS. 7A and 7B are diagrams showing in-plane and perpendicular magnetic tunnel junctions, in accordance with the techniques of this disclosure. FIG. 8 is a graph illustrating the dependence of conductance on the relative angle between the magnetizations of left and right Weyl contacts, in accordance with the techniques of this disclosure. Although FIGS. 7A and 7B show the relative angle between the magnetizations as a single angle, the relative angle may include a polar angular component and an azimuth angular component.

The conductance of an MTJ device may depend on the relative angle between magnetization states of the Weyl semimetal contacts on either side of the dielectric layer. For iMTJs, the electrons with different chirality have different in-plane momentum. Thus, the antiparallel conductance is represented by the square symbols in FIG. 8 as several orders of magnitude smaller than in the parallel configuration.

For pMTJs, the electronic states at each momentum are coherent superpositions of left- and right-handed states. Hence, chirality does not manifest during tunneling and the antiparallel conductance is finite, as shown by the triangle symbols shown in FIG. 8. FIG. 8 shows the angular dependence of the conductance in units of $e^2/h$ for both pMTJ and iMTJ with in-plane magnetization rotation. $\beta$=500 meV and a doping level of $\mu$=250 meV for the calculations shown in FIG. 8. For the iMTJ case represented by square symbols, the conductance in the antiparallel configuration is observed to be orders of magnitude smaller than in the parallel configuration, and is limited by the finite electron damping. Hence, in theory, electrons may be able to transmit if chirality is conserved.

In the pMTJ case where both magnetizations are in the out-of-plane orientation, the bulk Fermi surface around different Weyl nodes are projected on the top of one another in the $k_\parallel$-space. As a result, quasi-particles with a given $k_\parallel$ are in coherent superpositions of right- and left-handed states and, therefore, have no well-defined chirality. The full angular dependence of conductance for pMTJs is shown in FIG. 8, represented by the triangular symbols. Contrary to the iMTJ case, the antiparallel conductance of pMTJs is only an order of magnitude smaller than its parallel configuration counterpart. The antiparallel resistances of these two distinct situations, iMTJs and pMTJs, differ by several orders of magnitude, allowing for experimental validation of the proposed physics.

From the analysis above, an ideally infinite TMR ratio can be expected for Weyl iMTJs, as in ideal half-metallic MTJs. However, FIG. 8 suggests the conductance exhibits a stronger angular dependence around R=180 degrees. In order to quantify how fast the conductance reaches its minimum value, a polynomial function of the small angular deviations $\theta_{AP}$ around $\theta_R$=180 degrees can be fitted to the iMTJ curve of FIG. 8. The best fit is $\theta_{AP}^3$, which is represented by the solid in FIG. 8 and is faster than the $\theta_{AP}^2$ for trivial MTJs. In Equation (18), $\sin(\theta_{AP}/2)$ accounts for spinor wavefunction overlap with an additional angular dependence in the Dirac delta function, which further accounts for the Fermi surface mismatch of the two contacts due to the magnetization misalignment. Equations (19) and (20) show the transmission probability, where the additional $\sin(\theta_{AP}/2)$ describes the angular dependence of the $k_\parallel$-space overlap of the projected bulk Fermi surfaces.

$$M_{LR}(\theta_{AP}) \propto \sin(\theta_{AP}/2)\delta(q_L - q_R)(\theta_{AP}) \quad (19)$$

$$T = \int dq_L dq_R |M_{LR}(\theta_{AP})|^2 \propto \quad (20)$$

$$\sin(\theta_{AP}/2)^2 \int dq_L dq_R \delta(q_L - q_R(\theta_{AP}))^2 \propto \sin(\theta_{AP}/2)^2 \sin(\theta_{AP}/2) \approx \theta_{AP}^3$$

$$P(\theta_{AP}) = A \times \exp(-K_{eff}\theta_{AP}^2/k_B T) \quad (21)$$

$$\sigma = \sqrt{k_B T / 2K_{eff}} \quad (22)$$

Figures 9A, 9B:
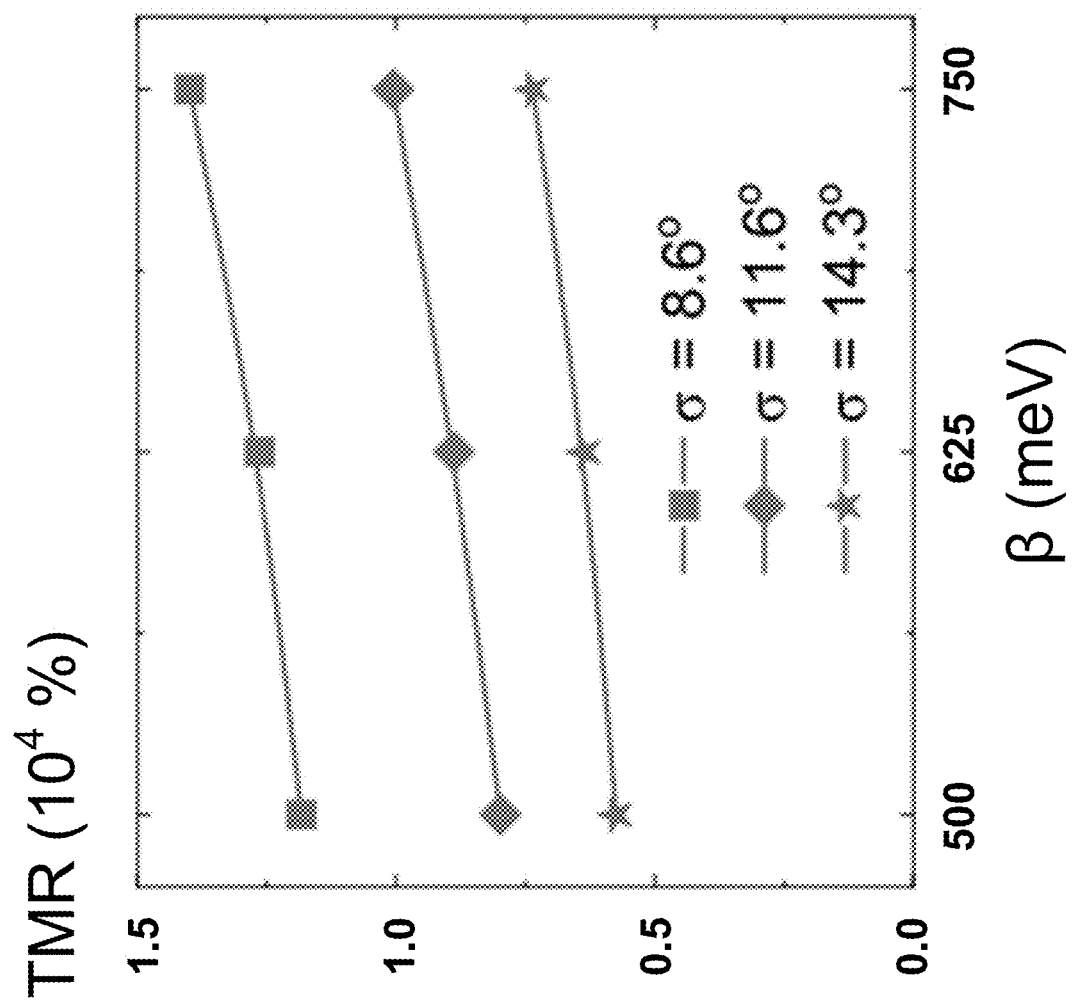
FIGS. 9A and 9B are diagrams illustrating the relationship between the tunneling magnetoresistance and an angular window of the magnetization, in accordance with the techniques of this disclosure.

Therefore, realistic estimation of the size of the TMR should include thermal fluctuation that gives rise to an angular window around which the magnetization fluctuates. The effect on the TMR can be estimated by convoluting the angular dependent conductance with a Gaussian kernel of spread $\sigma$ centered around $\theta_R$=zero and $\theta_R$=180 degrees for parallel and antiparallel alignments, respectively. The magnetization orientation can be described by a Boltzmann distribution as shown in Equation (21), where A is some normalization constant, Keff is the effective anisotropy coefficient, T is the temperature, and $k_B$ is the Boltzmann constant. The Gaussian distribution spread is shown in Equation (22). FIG. 9B shows the TMR obtained from this procedure at different values for Weyl iMTJs. In all three cases shown in FIG. 9B, $\beta$ has an effect on the TMR ratio. Thus, gigantic TMR ratios of approximately ten thousand percent can be obtained for the range of experimentally relevant values of $\sigma$.

FIGS. 9A and 9B are diagrams illustrating the relationship between the TMR and an angular window of the magnetization, in accordance with the techniques of this disclosure. In theory, the TMR ratio can be infinite for Weyl semimetal iMTJs. In real systems, thermal fluctuations can decrease the TMR because there is a small angular window where a magnetization state of the Weyl semimetal layer fluctuates. FIG. 9B shows the simulated TMR ratio considering increasing angular windows of 8.6, 11.6, and 14.3 degrees due to thermal fluctuations. The parameter $\beta$ is related to the saturation magnetization or to exchange splitting of the Weyl semimetal. FIG. 9B shows that TMR ratios increase linearly with $\beta$, and TMR ratios as large as ten thousand percent are possible for MTJs with at least one Weyl semimetal layer. Existing Fe/MgO/Fe MTJs may have TMR ratios that are less than one thousand percent or even as low as two or three hundred percent.

Figure 10:
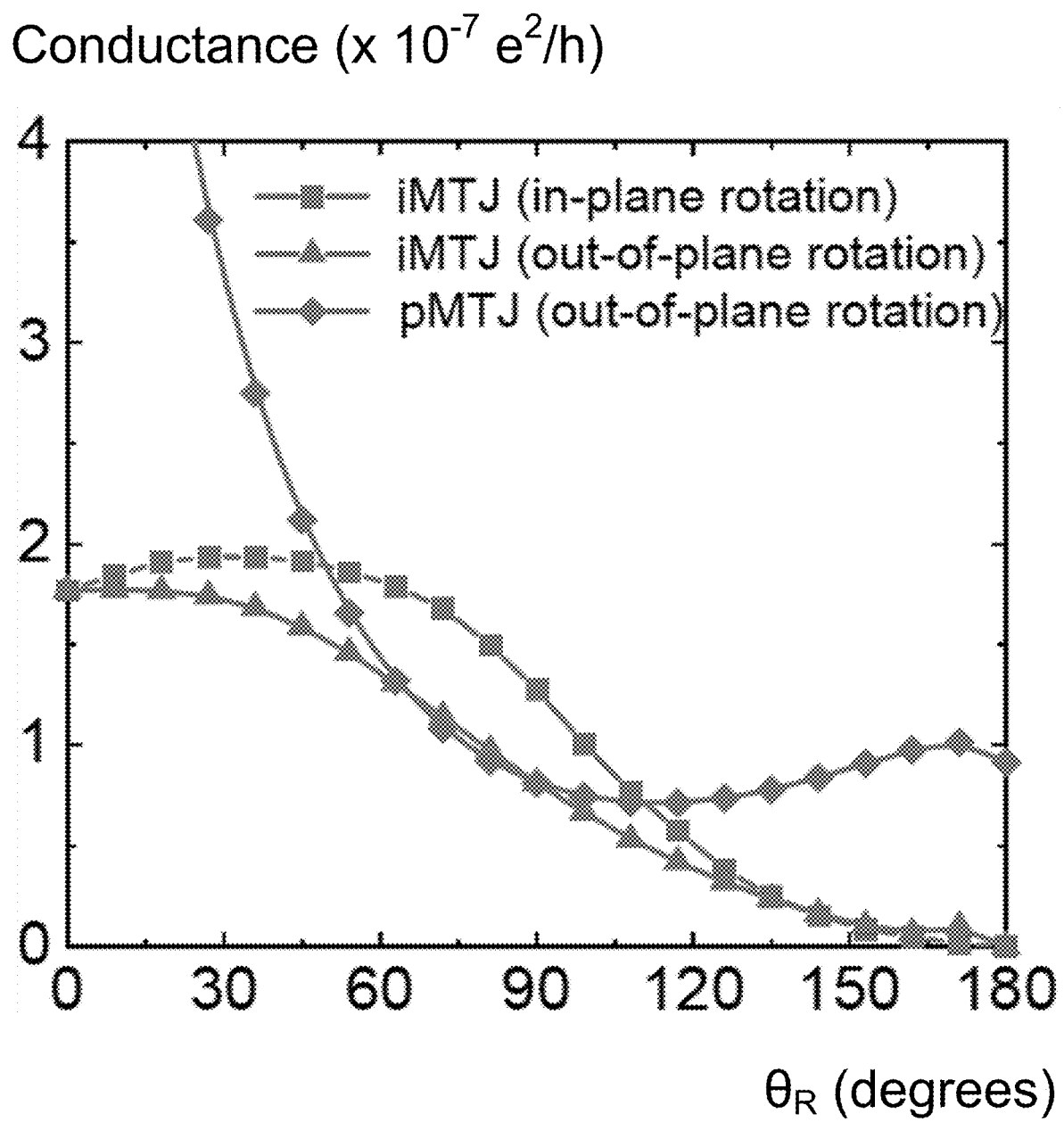
FIG. 10 is a graph of the angular dependence of quantum conductance of Weyl semimetal devices, in accordance with the techniques of this disclosure.

FIG. 10 is a graph of the angular dependence of quantum conductance of Weyl semimetal devices, in accordance with the techniques of this disclosure. FIG. 10 shows the angular dependence of a Weyl semimetal iMTJ with in-plane rotation represented by squares. The angular dependence of a Weyl semimetal iMTJ with out-of-plane rotation is represented by triangles. The angular dependence of a Weyl semimetal out-of-plane MTJ with out-of-plane rotation is represented by rhombuses. The graph shown in FIG. 10 assumes $\beta$ equals 500 meV and the doping level $\mu$=0.25 eV, which are measured in relation to the energy location of the Weyl semimetal nodes.

The gigantic TMR ratio of Weyl iMTJs can remain robust as long as the chirality around each Weyl node is well-defined. As the doping levels are increased, the Fermi surfaces of the two Weyl nodes merge together, at the so-called Lifshitz transition point, destroying the well-defined handedness of carriers. Under such high doping, the antiparallel resistance becomes finite, and no gigantic TMR ratios are observed.

In existing MTJs composed of non-Weyl FM contacts, the angular dependence of the conductance obeys $G_0 \times (1+P_L P_R \cos(\theta))$, where $P_{L(R)}$ represents the tunneling spin polarization of the left (right) FM, and $G_0$ is a multiplicative constant. Contrary to these existing MTJs, Weyl-semimetal MTJs present a non-trivial anisotropic angular dependence of conductance. This behavior is presented in FIG. 10 for pMTJs (rhombuses) and iMTJs with in-plane (squares) and out-of-plane (triangles) magnetization rotations. Particularly, the conductance of Weyl iMTJs has a maximum at $\theta_R \approx 30$ degrees when the magnetization is rotated in-plane. As the magnetization of the right Weyl contact is rotated, its entire bulk Fermi surface rotates accordingly creating a mismatching of momentum states between the two contacts. This accounts for the universal enveloping decreasing conductance with increasing $\theta_R$.

Departure from a monotonic decrease of conductance with increasing $\theta_R$ can be attributed to the presence of topologically protected Fermi arc states. Due to magnetization misalignment, the surface Fermi arc states can overlap with the bulk states of the opposite contact, leading to transmission hot spots. Since these Fermi arc states coexist with the bulk states due to the absence of bulk gap, their wavefunctions generally extend into the bulk. When the magnetization of the right contact in an iMTJ is rotated out-of-plane, the bulk-to-Fermi arc mode matching is largely suppressed. Hence, there is little or no enhancement in the transmission at $\theta_R > 0$. Because tunneling quasi-particles have no well-defined chirality in pMTJs, a small transmission enhancement is allowed to occur for $\theta_R > 90$, as observed in FIG. 10, by virtue of the increasing Fermi surface overlap with minimal Fermi arc mode matching, which are counterbalanced by the spinor mismatch only.

Figure 11:
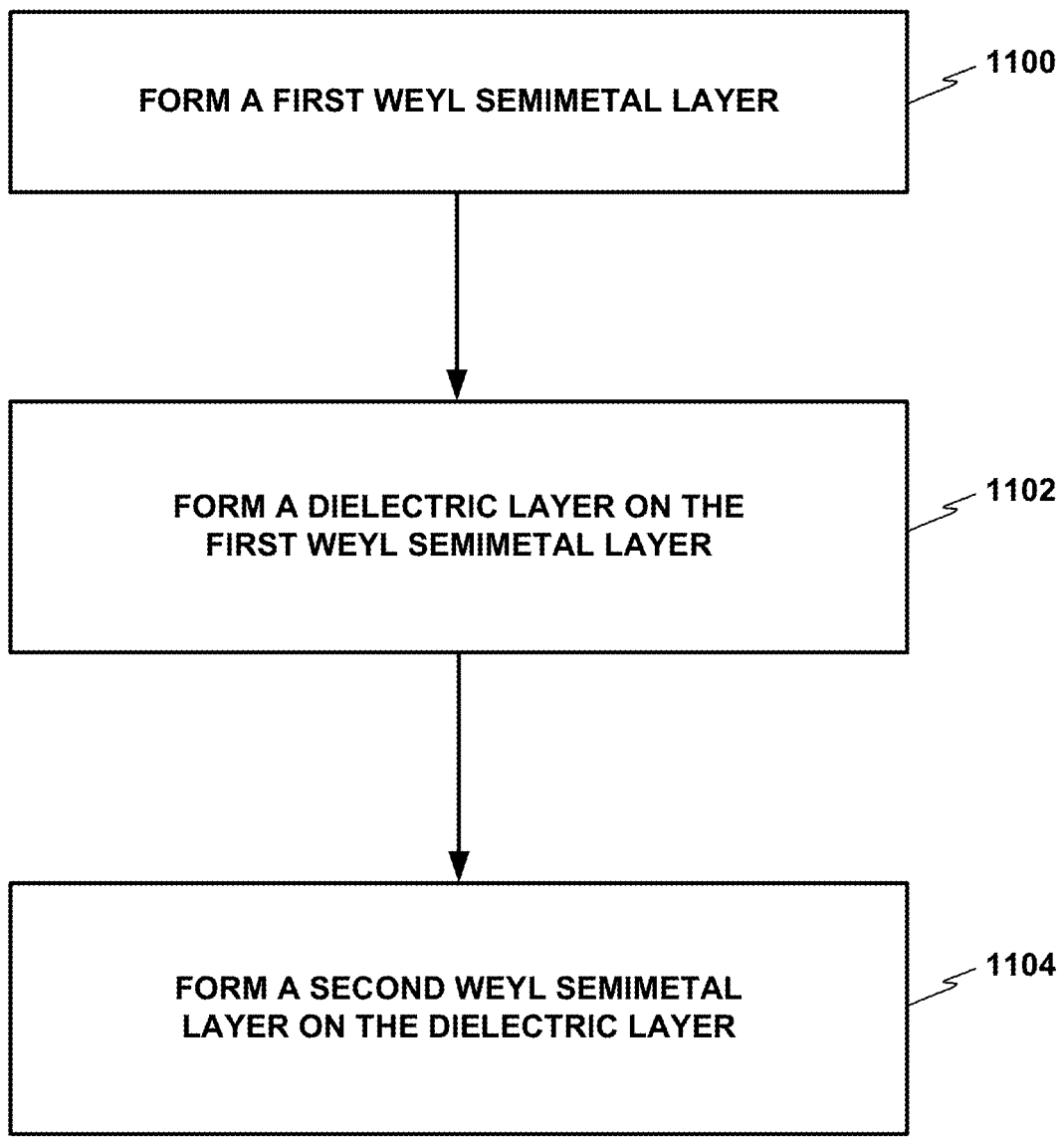
FIG. 11 is a flowchart illustrating example techniques for assembling a Weyl semimetal device, in accordance with the techniques of this disclosure.

FIG. 11 is a flowchart illustrating example techniques for designing and manufacturing a magnetic device, in accordance with the techniques of this disclosure. The example techniques of FIG. 11 are described with respect to device 100 shown in FIG. 1, although other components and devices such as devices 200, 300, 400, and 500 shown in FIGS. 2-5 may exemplify similar techniques.

In the example of FIG. 11, Weyl semimetal layer 110 is formed (1100). Weyl semimetal layer 110 can be formed on a substrate or on an electrode using, for example, magnetron sputtering and/or epitaxial growth or other growth methods. Then, dielectric layer 120 is formed on Weyl semimetal layer 110 (1102). Dielectric layer 120 can be formed by sputtering. Layer 130, which may include a Weyl semimetal material in some examples, is formed on dielectric layer 120 (1104).

Sputtering, chemical vapor deposition (CVD), plasma enhanced CVD, molecular beam epitaxy, atomic layer deposition, or evaporation deposition may be used in the formation of layers 110, 120, and 130. The techniques may allow for a good lattice match between layers 110 and 120 and between layers 120 and 130, which can facilitate the growth of a high-quality MTJ. For example, a good lattice match may be beneficial for epitaxial growth.

This disclosure has described the TMR effect in MTJs comprising of Weyl semimetal contacts. By means of the Bardeen transfer Hamiltonian formalism, the chirality-magnetization locking can largely suppress the conductance when the magnetization are perfectly antiparallel, leading to a giant TMR. The resulting TMR ratio is created by Weyl nodes with opposite chirality that are separated in the surface Brillouin zone, irrespective of the number of these crossing points. In an experimental setup, thermal fluctuations affect the TMR ratio, and magnetization fluctuations can result in a gigantic TMR on the order of ten thousand percent. Numerical quantum transport simulations reveal the contributions of Fermi arcs surface states, which are reflected in the non-monotonic dependence of conductance on the magnetization angle.

Various examples have been described. These and other examples are within the scope of the following claims.

The invention claimed is:

1. A device comprising a magnetic tunnel junction including:
a first Weyl semimetal layer;
a second Weyl semimetal layer; and
a dielectric layer positioned between the first and second Weyl semimetal layers,
wherein at least one of the first Weyl semimetal layer or the second Weyl semimetal layer forms a free layer having a switchable magnetization state, and
wherein a resistance of the magnetic tunnel junction is based on a magnetization state of at least one of the first Weyl semimetal layer or the second Weyl semimetal layer having the switchable magnetization state.

2. The device of claim 1,
wherein the first Weyl semimetal layer comprises a first Weyl semimetal material in a first composition, and
wherein the second Weyl semimetal layer comprises a second Weyl semimetal material in a second composition.

3. The device of claim 2,
wherein the first Weyl semimetal layer is part of a first composite structure,
wherein the second Weyl semimetal layer is part of a second composite structure,
wherein the dielectric layer is positioned between the first and second composite structures, and
wherein the first composite structure comprises at least one additional layer of material different from the first and second Weyl semimetal materials.

4. The device of claim 2, wherein the first Weyl semimetal material comprises EuCdAs, CoSnS, Co$_2$TiGe, LaAlGe, PrAlGe, or CoMn$_2$Ga.

5. The device of claim 2, wherein the first Weyl semimetal material comprises a magnetic Weyl semimetal material.

6. The device of claim 1, wherein a tunnel magnetoresistance ratio of the device is greater than five thousand percent.

7. The device of claim 1, wherein a tunnel magnetoresistance ratio of the device is greater than three thousand percent.

8. The device of claim 1, wherein a tunnel magnetoresistance ratio of the device is greater than one thousand percent.

9. The device of claim 1, wherein a tunnel magnetoresistance ratio of the device is greater than five hundred percent.

10. The device of claim 1, wherein the dielectric layer comprises a tunnel barrier layer including an oxide material.

11. The device of claim 10, wherein the oxide material includes MgO, Al$_2$O$_3$, or MgAl$_2$O$_4$.

12. The device of claim 1, further comprising
a spin Hall channel coupled to the second Weyl semimetal layer;
a first terminal coupled to the spin Hall channel;
a second terminal coupled to the spin Hall channel; and
a third terminal coupled to the first Weyl semimetal layer,
wherein the controller is configured to apply the second voltage across the first and second terminals to switch the magnetization orientation of the second Weyl semimetal layer.

13. A device comprising a magnetic tunnel junction including:
a first layer;
a second layer comprising a Weyl semimetal material; and
a dielectric layer positioned between the first and second layers,
wherein the magnetic tunnel junction has a tunnel magnetoresistance ratio greater than one thousand percent.

14. The device of claim 13,
wherein the second layer is part of a composite structure,
wherein the dielectric layer is positioned between the first layer and the composite structure, and
wherein the composite structure comprises at least one additional layer of material different from the Weyl semimetal material.

15. The device of claim 13, wherein the Weyl semimetal material comprises EuCdAs, CoSnS, Co$_2$TiGe, LaAlGe, PrAlGe, or CoMn$_2$Ga.

16. The device of claim 13, wherein the tunnel magnetoresistance ratio of the device is greater than five thousand percent.

17. The device of claim 13, wherein the tunnel magnetoresistance ratio of the device is greater than three thousand percent.

18. The device of claim 13, wherein the dielectric layer comprises a tunnel barrier layer including MgO, Al$_2$O$_3$, or MgAl$_2$O$_4$.

19. A method comprising:
forming a first Weyl semimetal layer;
forming a dielectric layer on the first Weyl semimetal layer; and
forming a second Weyl semimetal layer on the dielectric layer,
wherein at least one of the first Weyl semimetal layer or the second Weyl semimetal layer forms a free layer having a switchable magnetization state, and
wherein a resistance of the magnetic tunnel junction is based on a magnetization state of at least one of the first Weyl semimetal layer or the second Weyl semimetal layer having the switchable magnetization state.

20. The method of claim 19,
wherein forming the first Weyl semimetal layer comprises forming a first layer of a first Weyl semimetal material on a substrate, and
wherein forming the second Weyl semimetal layer comprises forming a second layer of the first Weyl semimetal material on the dielectric layer.

* * * * *